US010299416B2

(12) United States Patent
Vehkapera

(10) Patent No.: US 10,299,416 B2
(45) Date of Patent: May 21, 2019

(54) SHIELD FOR ELECTRONIC COMPONENTS

(71) Applicant: Microsoft Technology Licensing, LLC, Redmond, WA (US)

(72) Inventor: Ville Vehkapera, Oulu (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/194,931

(22) Filed: Jun. 28, 2016

(65) Prior Publication Data
US 2017/0374769 A1 Dec. 28, 2017

(51) Int. Cl.
*H05K 9/00* (2006.01)
*H05K 1/02* (2006.01)
*H05K 3/22* (2006.01)

(52) U.S. Cl.
CPC ......... *H05K 9/0024* (2013.01); *H05K 1/0216* (2013.01); *H05K 3/22* (2013.01); *H05K 9/0015* (2013.01); *H05K 9/0032* (2013.01); *H05K 2203/17* (2013.01)

(58) Field of Classification Search
CPC .... H05K 9/0024; H05K 9/0015; H05K 5/061; H05K 9/0037; H05K 9/0009
See application file for complete search history.

(56) References Cited

U.S. PATENT DOCUMENTS

| 4,831,498 | A * | 5/1989 | Baba | H05K 9/0033 |
| | | | | 174/356 |
| 6,169,665 | B1 * | 1/2001 | Lepping | H05K 9/0032 |
| | | | | 174/350 |
| 6,239,359 | B1 * | 5/2001 | Lilienthal, II | H05K 9/0028 |
| | | | | 174/370 |
| 6,324,074 | B1 * | 11/2001 | Lunden | H04B 1/3827 |
| | | | | 174/377 |
| 2004/0188120 | A1 | 9/2004 | Komatsu et al. | |
| 2004/0240191 | A1 | 12/2004 | Arnold et al. | |

(Continued)

FOREIGN PATENT DOCUMENTS

| GB | 2252677 A | 8/1992 |
| GB | 2306790 A | 5/1997 |
| WO | 2014063060 A1 | 4/2014 |

OTHER PUBLICATIONS

Geetha et al., "EMI Shielding: Methods and Materials—A Review," *Journal of Applied Polymer Science*, vol. 112, Feb. 13, 2009, pp. 2073-2086.

(Continued)

*Primary Examiner* — Steven T Sawyer
(74) *Attorney, Agent, or Firm* — Klarquist Sparkman, LLP

(57) ABSTRACT

Technologies are described for shielding electronic components. In one embodiment, a conductive gasket includes a gasket body. A conductive shield has a plurality of projections extending therefrom sufficient to deform the gasket body to couple the conductive shield and the conductive gasket together. The projections can be pointed teeth designed for penetrating the conductive gasket so as to electrically and mechanically couple the conductive shield to the conductive gasket. The conductive gasket can be stacked onto the conductive shield to form a sidewall, which can be mounted on a PCB. A conductive cover can then be placed on the conductive gasket to create a cavity in which electronic components can be positioned.

19 Claims, 5 Drawing Sheets

(56) References Cited

U.S. PATENT DOCUMENTS

| | | | |
|---|---|---|---|
| 2005/0162841 A1 | 7/2005 | Ogatsu | |
| 2005/0205279 A1 | 9/2005 | Cochrane | |
| 2007/0209833 A1 | 9/2007 | English | |
| 2008/0130260 A1 | 6/2008 | Kouda et al. | |
| 2008/0137320 A1 | 6/2008 | Ball | |
| 2009/0008431 A1 | 1/2009 | Zonvide et al. | |
| 2010/0224401 A1 | 9/2010 | Lin et al. | |
| 2011/0279995 A1 | 11/2011 | Bayar et al. | |
| 2012/0049700 A1 | 3/2012 | Cochrane | |
| 2012/0090886 A1 | 4/2012 | Park et al. | |
| 2013/0025928 A1 | 1/2013 | Quek et al. | |
| 2013/0077282 A1 | 3/2013 | Malek et al. | |
| 2013/0120957 A1* | 5/2013 | Werner | H05K 9/0032 361/818 |
| 2013/0286609 A1 | 10/2013 | Merz | |
| 2014/0078677 A1 | 3/2014 | Dolci et al. | |
| 2014/0268583 A1 | 9/2014 | Ding | |
| 2014/0313680 A1* | 10/2014 | Kil | H05K 9/0032 361/752 |
| 2015/0366109 A1 | 12/2015 | McKervey | |
| 2016/0344444 A1* | 11/2016 | Yang | H05K 9/0024 |

OTHER PUBLICATIONS

"International Search Report and Written Opinion Issued in PCT Application No. PCT/US2017/036937", dated Aug. 9, 2017, 15 pages.

* cited by examiner

SHIELD FOR ELECTRONIC COMPONENTS

BACKGROUND

Electromagnetic shielding reduces electromagnetic fields emanating from electronic devices (e.g., cellular phones or other mobile devices) by using barriers made of conductive material. The result is to isolate the electronic device from its environment. Government regulations control an amount of electromagnetic fields which devices can emit so that other electronics in the vicinity are not negatively impacted. The shielding can reduce a variety of types of interference including electrostatic fields, electromagnetic fields and radio waves.

For Printed Circuit Boards (PCB), conventional shielding solutions have an enclosure covering the electronic components. Typically, a first air gap is placed between the electronic components and a shielding roof. A second air gap is positioned above the shielding roof and a device cover. The air gaps increase the overall height of the device, which can be a disadvantage in mobile devices, such as cellular phones, where device thinness is a desirable and marketable feature.

Therefore, there exists ample opportunity for improvement in technologies related to shielding.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Technologies are described for shielding electronic components. In one embodiment, a conductive gasket includes a gasket body. A conductive shield has a plurality of projections extending therefrom sufficient to deform the gasket body to couple the conductive shield and the conductive gasket together. The projections can be pointed teeth designed for penetrating the conductive gasket so as to electrically and mechanically couple the conductive shield to the conductive gasket.

The conductive gasket can be stacked onto the conductive shield to form a sidewall, which can be mounted on a PCB. A conductive cover can then be placed on the conductive gasket to create a cavity in which electronic components (mounted on the PCB) can be positioned.

The projections can be a first metal hardness while the conductive gasket can be a second metal hardness, softer than the first metal hardness. The different degrees of hardness allow the projections to deform the conductive gasket, such as by piercing the conductive gasket body so as to couple together the conductive gasket and the conductive shield.

In a method of shielding, a conductive shield is attached to a PCB, such as by soldering. The conductive shield includes a plurality of projections extending therefrom. A conductive gasket can be placed onto the conductive shield. A cover can be placed over the conductive gasket. Sufficient compression can be used to urge the conductive gasket and the conductive shield together so that the projections penetrate the conductive gasket to couple together the conductive shield and the conductive gasket.

There are several advantages to the embodiments described herein. First, the structure of the conductive shield, the conductive gasket and the cover allow a reduced height of the overall device as only one air gap is present, whereas previous solutions required two air gaps. Secondly, due to the projections, minimal compression is needed to couple the conductive gasket and the conductive shield. A reduced level of compression reduces failure rates during assembly. The penetrating projections further allow the cover to be leveled on the conductive gasket even if the cover has imperfections (e.g., a varying thickness). Specifically, some of the projections can penetrate more than others so as to correct any cover imperfections. Moreover, the different thicknesses of the conductive shield and conductive gasket provide a degree of tolerance in terms of assembly errors.

As described herein, a variety of other features and advantages can be incorporated into the technologies as desired.

DETAILED DESCRIPTION

Overview

Figure 1:
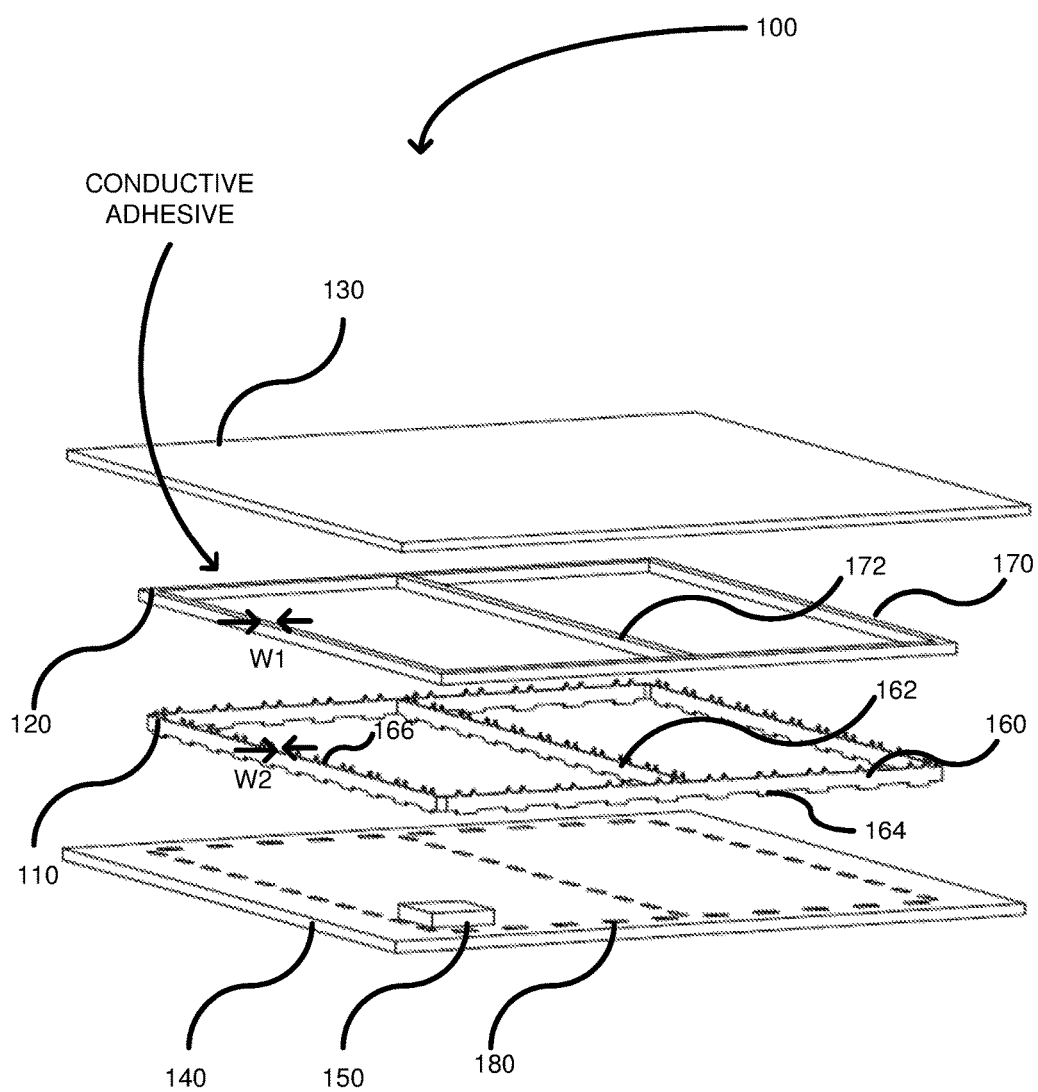
FIG. 1 is an assembly drawing of shielding components on a PCB, including a conductive cover, a conductive gasket, and a conductive shield.

As described herein, various technologies can be applied for shielding of electronic components. FIG. 1 shows a shielding assembly generally at 100. The shielding includes a conductive shield 110, a conductive gasket 120 and a conductive cover 130, all of which can be placed over a Printed Circuit Board (PCB) 140. The conductive shield 110 and conductive gasket 120 form side walls of a shielded cavity in which electronic components 150, such as Integrated Circuits, are positioned. Although only one electronic component 150 is shown, typically the PCB will have many electronic components mounted thereon. The conductive shield 110, conductive gasket 120, and the cover 130 surround the electronic components to provide shielding thereof.

The conductive shield 110 includes an outer periphery 160 and can include a cross-bar 162 for additional structural support. A bottom side of the conductive shield 110 includes a plurality of spaced-apart legs 164 that are used for mounting the conductive shield 110 to the PCB 140. A top side of the conductive shield includes a plurality of mechanical projections 166. The projections 166 are generally pointed teeth having a triangular shape, but other shapes can be used. The illustrated projections 166 include two projections for each leg 164, but a different ratio can be used. Alternatively, the teeth positions can be independent of the legs 164. Moreover, the conductive shield 110 can be made of sheet metal, a metal screen (with holes significantly smaller than the wavelength of radiation), metal foam, or a non-metal (e.g., plastic) coated with a metallic material. The projections are monolithic with the periphery 160 and made of the same material, but alternative structures can include separate projections 166. As further described below, the sharp projections 166 are used for electrically and mechanically coupling the conductive shield 110 to the conductive gasket 120.

The conductive gasket 120 includes an outer periphery 170 and can include a cross-bar 172 for additional structural support. The conductive gasket 120 can be made from a variety of conductive materials, but is generally a softer material than the conductive shield 110. In one example, the conductive gasket 120 can be made of conductive fibrous material. In this way, the projections of the conductive shield 110 can deform the conductive gasket, through puncturing the outer periphery 170 or through bending the outer periphery at the point of contact with the projections. Other materials can be used for the conductive gasket including any metals that are softer than sheet metal, for example. Additionally, the conductive gasket 120 is a width shown as W1, which is wider than a width W2 of the conductive shield. The wider width W1 allows greater tolerances during assembly. The conductive gasket 120 is sized to provide adequate clearance between the electronic components 150 and the cover 130.

The cover 130 is made of conductive material (e.g., sheet metal or the other materials identified above) and is adhered to the conductive gasket 120 using a conductive adhesive. The cover 130 is sized so as to lay on the outer periphery 170 of the conductive gasket 120. The cover 130 is designed to enclose a cavity created by the side walls of the conductive gasket 120 and conductive shield 110.

The PCB has a flat surface for which multiple electronic or electrical components can be mounted, such as the component 150. Additionally, the PCB has a plurality of slots 180 sized for receiving corresponding legs 164 of the conductive shield. Although shown as a PCB, other boards can be used, such as a flexible circuit.

Figure 2:
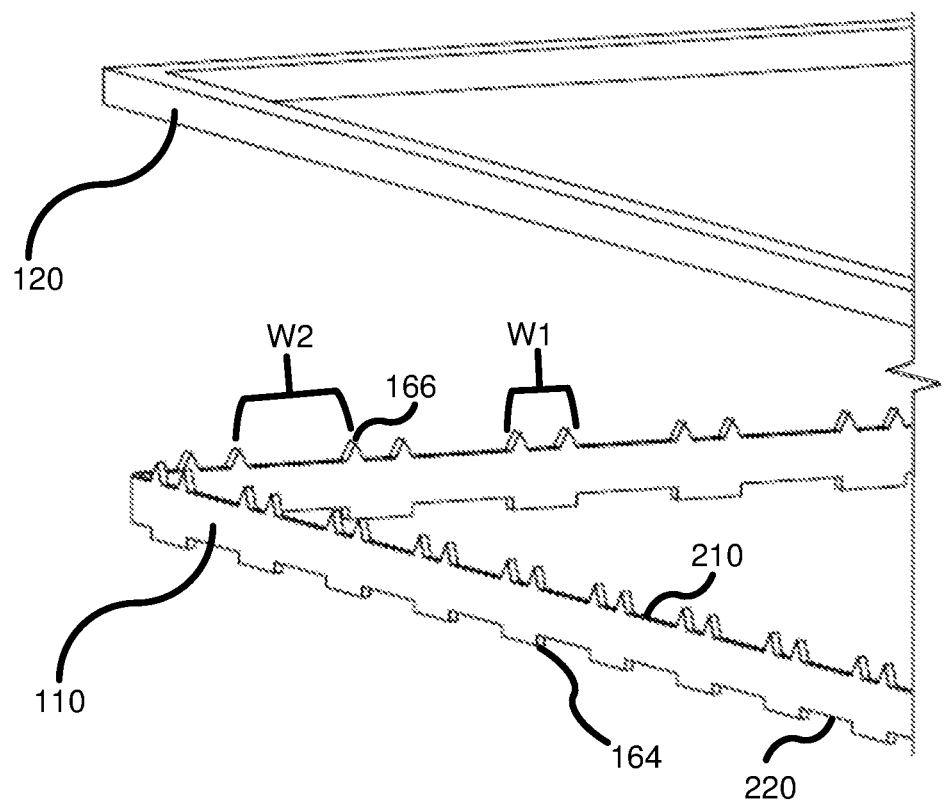
FIG. 2 is a perspective view of the conductive gasket and conductive shield.

FIG. 2 shows further details of the conductive gasket 120 and the conductive shield 110. The conductive shield 110 has a top side 210 from which the mechanical projections 166 extend. The projections 166 are shown as pointed teeth of a triangular shape, but the other projection shapes can be used. The projections 166 are two to a group that are aligned with each leg 164 located on a bottom side 220 of the conductive shield 220, wherein the group is shown having a width W1. The spacing between groups is shown by W2, which is a greater distance than W1. Other spacings can be used depending on the design. The number of projections 166 control a contact area between the conductive shield and the conductive gasket. The legs 164 are shown as rectangular shaped and sized to fit within slots 180 on the PCB for soldering. Other shapes for the legs 164 can also be used.

Figure 3:
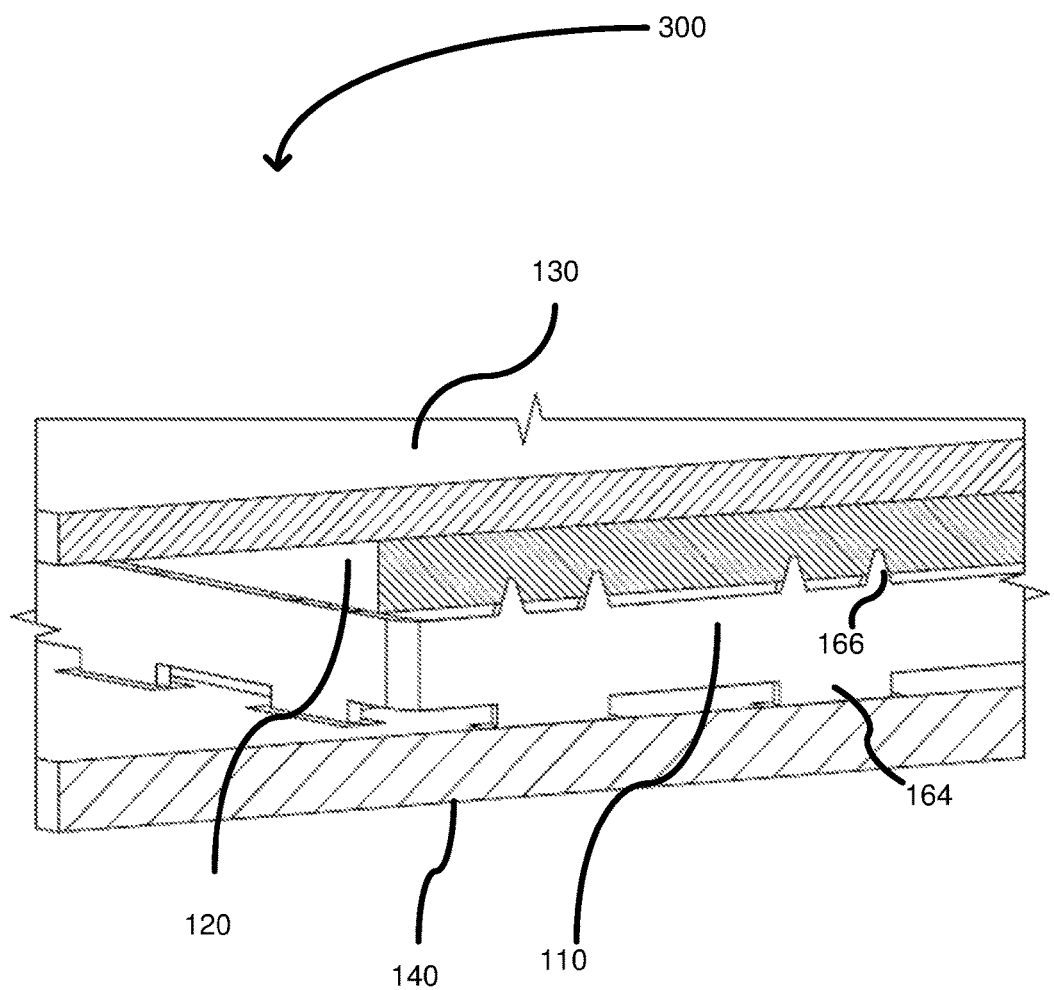
FIG. 3 is a cross-sectional view of the conductive gasket, conductive shield and conductive cover assembled together.

FIG. 3 shows a cross-sectional view 300 with the conductive shield 110, the conductive gasket 120, the cover 130 and the PCB 140 assembled together. The mechanical projections 166 are shown deforming the conductive gasket 120. Depending on the material used for the conductive gasket, the projections 166 can either pierce through the conductive gasket 120 or otherwise bend to receive the projections. Thus, by deforming the conductive gasket it is meant that the shape of the outer surface of the conductive gasket is changed either by piercing the surface or by bending the surface of the conductive gasket. The projections 166 can be pointed teeth that are sufficiently sharp to puncture through the conductive gasket, particularly when a fibrous material is used for the conductive gasket. As can readily be seen, the conductive gasket 120 is mounted on top of the conductive shield 110 so as to form a side wall upon which the cover 130 sits. The penetrating projections 166 allow imperfections in the cover 130 or the conductive gasket to be masked because the projections are embedded within the conductive gasket at variable depths. Thus, one of the projections 166 can penetrate into the conductive gasket at a different depth than other projections so as to provide a degree of tolerance during assembly of the cover 130. More particularly, the cover 130 can be mounted parallel to the PCB even if the cover is uneven due to the variable depth in which the projections 166 embed within the conductive gasket 120. There may be a small gap between the conductive gasket and the conductive shield and that gap is controlled by the depth in which the projections 166 embed within the conductive gasket. The conductive gasket is also designed to provide a desired height of the cavity in which the electronic components sit. The projections 166 allow for both an electrical and mechanical coupling between the conductive shield and the conductive gasket.

Figure 4:
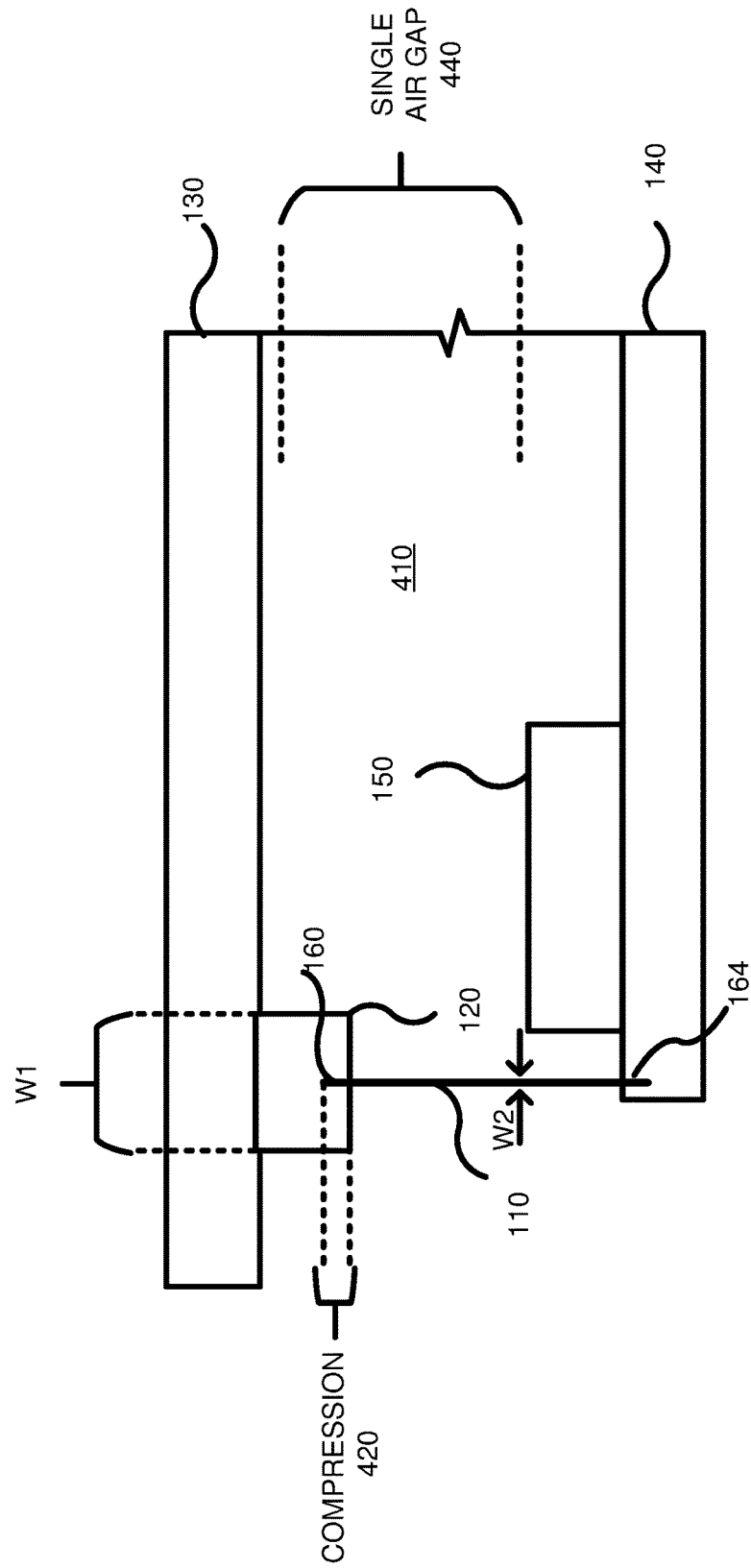
FIG. 4 is a side-elevational view showing a PCB with the shielding components mounted thereon.

FIG. 4 shows a side elevational view of the conductive shield 110, the conductive gasket 120, the cover 130 and the PCB 140 assembled together. The side walls formed by the conductive gasket 120 and the conductive shield 110 combined with the cover 130 form a cavity 410 to enclose the electronic component 150 (e.g., an Integrated Circuit) in a shielded environment. During assembly, the cover 130 and/or conductive gasket 120 are compressed (using a predetermined compression force) onto the conductive shield 110 so that the projections 160 embed in the conductive gasket 120 at a desired depth based on the compression force 420. The legs 164 are inserted into slots 180 and soldered. Because the device cover 130 is also used as a shielding cover, there is only a single air gap as shown at 440. For example, the device cover 130 can be a back plate of a cellular phone and, therefore, functions as the device cover. The projections provide an electrical and mechanical coupling of the conductive shield 110 and the conductive gasket 120. As shown in FIG. 4, the width W1 of the conductive gasket 120 is wider than the width W2 of the conductive shield. In some embodiments, the width W1 is twice that of W2, and in other embodiments the width W1 is greater than twice the width W2. The larger width W1 allows for a degree of error when assembling so that the conductive shield 110 need not be perfectly centered on the conductive gasket 120. Additionally, the conductive projections 160 allow for minimized compression force due to the minimized compression area (conductive contact area.)

Figure 5:
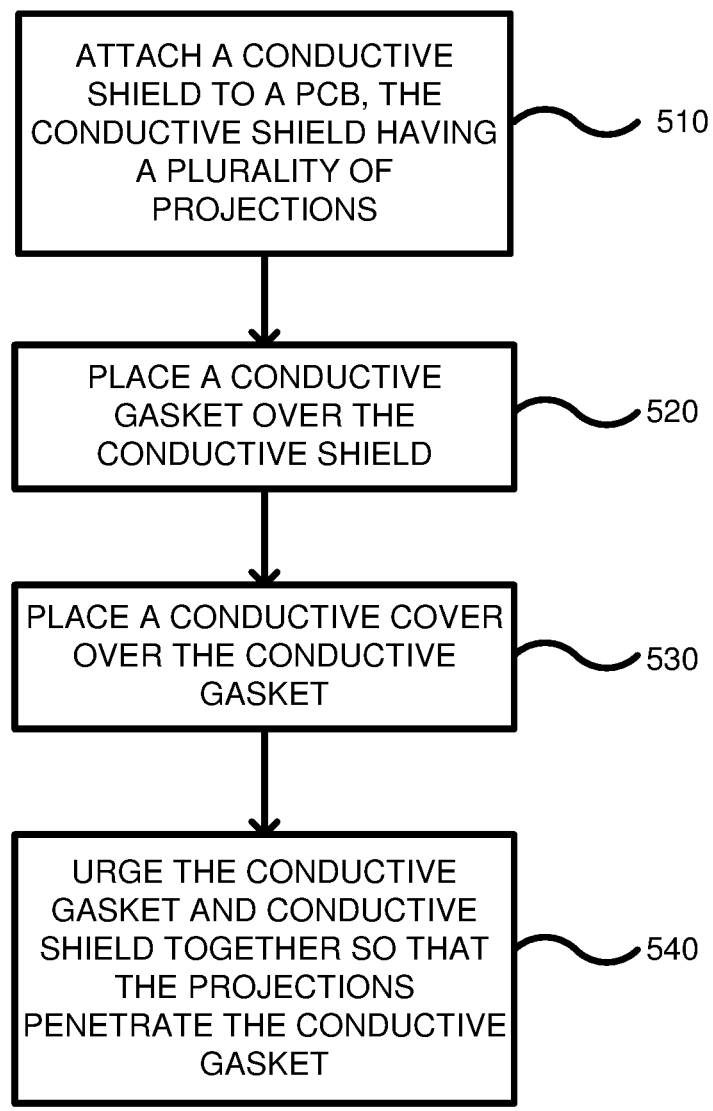
FIG. 5 is a flowchart of a method for shielding electronic components.

FIG. 5 is a flowchart of a method for shielding electronic components. In a process block 510, a conductive shield is attached to a PCB, such as by soldering or a pressure fit. The conductive shield includes a plurality of projections extending therefrom. The projections can be of different sizes or they can be a uniform size. In process block 520, a conductive gasket is placed over the conductive shield. The conductive gasket provides a desired clearance between the electronic components and the cover. In process block 530, a conductive cover is placed over the conductive gasket. The conductive cover creates an enclosure that is shielded for the electronic components positioned therein. In process block 540, the conductive gasket and conductive shield are urged together so that the projections penetrate the conductive gasket. The urging together can be accomplished using multiple techniques including placing force on the cover or force on the PCB or both to squeeze the layers together. Due to the piercing of the projections that couple the conductive gasket and the conductive shield, a reduced compression force is needed over prior assembly techniques. Additionally, the piercing of the projections creates an electrical and mechanical connection between the conductive shield and the conductive gasket.

Although the operations of some of the disclosed methods are described in a particular, sequential order for convenient presentation, it should be understood that this manner of description encompasses rearrangement, unless a particular ordering is required by specific language. For example, operations described sequentially may in some cases be rearranged or performed concurrently. Moreover, for the sake of simplicity, the attached figures may not show the various ways in which the disclosed methods can be used in conjunction with other methods.

The following paragraphs further describe embodiments of the electronic component:

A. An assembly for shielding electronic components, comprising:
  a conductive gasket having a gasket body; and
  a conductive shield having a plurality of mechanical projections extending therefrom sufficient to deform the gasket body to couple the conductive shield and conductive gasket together.

B. The assembly of paragraph A, further including a board for housing the electronic components, the conductive shield being mounted on the board for surrounding the electronic components to shield electromagnetic interference generated by the electronic components.

C. The assembly of any of paragraphs A-B, further including a conductive cover mounted to the conductive gasket to enclose the electronic components using the conductive gasket and conductive shield as side walls and the conductive cover to create a cavity in which the electronic components are positioned.

D. The assembly of any of paragraphs A-C, wherein the conductive gasket has a first metal hardness and the mechanical projections have a second metal hardness, the first metal hardness being softer than the second metal hardness, and wherein the deforming includes the mechanical projections penetrating into the gasket body.

E. The assembly of any of paragraphs A-D, wherein the gasket body is a first width and the conductive shield is a second width, wherein the first width is greater than the second width so as to allow a degree of error when mounting the gasket body on the conductive shield.

F. The assembly of any of paragraphs A-E, wherein the plurality of mechanical projections are spaced-apart, triangular-shaped pegs.

G. The assembly of any of paragraphs A-F, wherein the conductive shield has a first side from which the mechanical projections extend and a second side, opposite the first side, having a plurality of legs soldered to a printed circuit board upon which the electronic components are mounted.

H. The assembly of any of paragraphs A-G, wherein the coupling of the conductive shield to the conductive gasket is an electrical and mechanical coupling.

I. A method of shielding, comprising:
  attaching a conductive shield to a Printed Circuit Board (PCB), the conductive shield having a first side with a plurality of projections extending therefrom and a second side for coupling to the PCB;
  placing a conductive gasket over the conductive shield;
  placing a conductive cover over the conductive gasket; and
  urging a conductive gasket and the conductive shield together so that the plurality of projections of the conductive shield penetrate into the conductive gasket so as to couple the conductive gasket to the conductive shield.

J. The method of paragraph I, wherein the conductive shield is formed from a first metal and the conductive gasket is formed from a second metal, wherein the first metal is harder than the second metal.

K. The method of any of paragraphs I-J, wherein the conductive shield includes a side wall that is a first thickness and the conductive gasket includes a side wall that is a second thickness, wherein the first thickness is less than the second thickness.

L. The method of any of paragraphs I-K, wherein the plurality of projections are pointed teeth designed for penetrating into the conductive gasket and the urging includes subjecting the conductive gasket to a predetermined compression.

M. The method of any of paragraphs I-L, wherein the second side of the conductive shield has legs soldered to the PCB.

N. The method of any of paragraphs I-M, wherein the conductive gasket and the conductive shield have a contact area controlled by an amount of the plurality of projections.

O. A shielding assembly, comprising:
  a board having electronic components mounted thereon;
  a conductive shield having a periphery with pointed projections extending therefrom, the conductive shield mounted on the board so as to surround the electronic components;
  a conductive gasket sized to overlay the conductive shield to form side walls of an enclosed space, the conductive shield and conductive gasket being coupled together using the pointed projections; and
  a cover mounted on the conductive gasket to enclose the electronic components.

P. The shielding assembly of paragraph O, wherein the pointed projections are designed to penetrate into the conductive gasket to electrically connect the conductive shield to the conductive gasket.

Q. The shielding assembly of any of paragraphs O-P, wherein the cover is conductive and is coupled to the conductive gasket with conductive adhesive.

R. The shielding assembly of any of paragraphs O-Q, wherein the conductive shield is soldered to the board.

S. The shielding assembly of any of paragraphs O-R, wherein the conductive gasket is formed from a softer metal than the projections so that the projections can penetrate the conductive gasket.

T. The shielding assembly of any of paragraphs O-S, wherein the conductive gasket is at least twice as wide as the conductive shield.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:
1. An assembly for shielding electronic components, comprising:

a conductive gasket having a gasket body, the conductive gasket having first and second sides, which are smooth; a conductive shield having a plurality of mechanical projections extending therefrom sufficient to deform the gasket body to couple the conductive shield and conductive gasket together, wherein the plurality of mechanical projections include a first pair of projections and a second pair of projections directly adjacent to each other, wherein each pair of projections has a first distance between the individual projections, a second distance formed between the first pair of projections and the second pair of projections being larger than the first distance, wherein the conductive shield has a first side from which the mechanical projections extend and a second side, opposite the first side, having a plurality of legs for soldering the conductive shield to the printed circuit board; a conductive cover having a smooth side mounted to the conductive gasket, wherein the conductive cover mounts to one of the smooth first or second sides of the gasket; and a conductive adhesive layer to adhere the conductive cover to the conductive gasket.

2. The assembly of claim 1, further including a board for housing the electronic components, the conductive shield being mounted on the board for surrounding the electronic components to shield electromagnetic interference generated by the electronic components.

3. The assembly of claim 2, wherein the conductive cover is mounted to the conductive gasket to enclose the electronic components using the conductive gasket and conductive shield as side walls and the conductive cover to create a cavity in which the electronic components are positioned.

4. The assembly of claim 1, wherein the conductive gasket has a first metal hardness and the mechanical projections have a second metal hardness, the first metal hardness being softer than the second metal hardness, and wherein the deforming includes the mechanical projections penetrating into the gasket body.

5. The assembly of claim 1, wherein the gasket body is a first width and the conductive shield is a second width, wherein the first width is greater than the second width so as to allow a degree of error when mounting the gasket body on the conductive shield.

6. The assembly of claim 1, wherein the plurality of mechanical projections are spaced-apart, triangular-shaped pegs.

7. The assembly of claim 1, wherein the conductive shield has a first side from which the mechanical projections extend and a second side, opposite the first side, having a plurality of legs soldered to a printed circuit board upon which the electronic components are mounted.

8. The assembly of claim 1, wherein the coupling of the conductive shield to the conductive gasket is an electrical and mechanical coupling.

9. A method of shielding, comprising:
attaching a conductive shield to a Printed Circuit Board (PCB), the conductive shield having a first side with a plurality of projections extending therefrom and a second side for coupling to the PCB, wherein the plurality of projections include a first pair of projections and a second pair of projections directly adjacent to each other, wherein each pair of projections has a first distance between the individual projections, a second distance formed between the first pair of projections and the second pair of projections being larger than the first distance; placing a conductive gasket over the conductive shield, wherein the conductive gasket has smooth first and second gasket sides; placing a conductive cover over the conductive gasket so as to mount to the smooth second gasket side and adhering the conductive cover to the smooth second gasket side using an adhesive layer; and urging the conductive gasket and the conductive shield together so that the plurality of projections of the conductive shield penetrate into the conductive gasket on the smooth first side of the conductive gasket so as to couple the conductive gasket to the conductive shield.

10. The method of claim 9, wherein the conductive shield is formed from a first metal and the conductive gasket is formed from a second metal, wherein the first metal is harder than the second metal.

11. The method of claim 9, wherein the conductive shield includes a side wall that is a first thickness and the conductive gasket includes a side wall that is a second thickness, wherein the first thickness is less than the second thickness.

12. The method of claim 9, wherein the plurality of projections are pointed teeth designed for penetrating into the conductive gasket and the urging includes subjecting the conductive gasket to a predetermined compression.

13. The method of claim 9, wherein the second side of the conductive shield has legs soldered to the PCB.

14. The method of claim 9, wherein the conductive gasket and the conductive shield have a contact area controlled by an amount of the plurality of projections.

15. A shielding assembly, comprising: a board having electronic components mounted thereon; a conductive shield having a periphery with pointed projections extending from a first side therefrom, the conductive shield mounted on the board so as to surround the electronic components, wherein the pointed projections include a first pair of pointed projections and a second pair of pointed projections directly adjacent to each other, wherein each pair of the pointed projections has a first distance between the individual pointed projections, a second distance formed between the first pair of pointed projections and the second pair of pointed projections being larger than the first distance; a conductive gasket sized to overlay the conductive shield to form side walls of an enclosed space, the conductive shield and conductive gasket being coupled together using the pointed projections; and a cover mounted on the conductive gasket using an adhesive layer to enclose the electronic components, wherein the conductive gasket and the cover have smooth surfaces that are coupled together using a conductive adhesive.

16. The shielding assembly of claim 15, wherein the pointed projections are designed to penetrate into the conductive gasket to electrically connect the conductive shield to the conductive gasket.

17. The shielding assembly of claim 15, wherein the conductive shield is soldered to the board.

18. The shielding assembly of claim 15, wherein the conductive gasket is formed from a softer metal than the projections so that the projections can penetrate the conductive gasket.

19. The shielding assembly of claim 15, wherein the conductive gasket is at least twice as wide as the conductive shield.

* * * * *